United States Patent
Sollenberger et al.

(10) Patent No.: US 9,002,034 B2
(45) Date of Patent: *Apr. 7, 2015

(54) METHOD AND SYSTEM FOR AUDIO LEVEL DETECTION AND CONTROL

(75) Inventors: Nelson Sollenberger, Farmingdale, NJ (US); Radhakrishnan Kuzhipatt, Irvine, CA (US); Hongwei Kong, Denville, NJ (US)

(73) Assignee: Broadcom Corporation, Irvine, CA (US)

( * ) Notice: Subject to any disclaimer, the term of this patent is extended or adjusted under 35 U.S.C. 154(b) by 374 days.

This patent is subject to a terminal disclaimer.

(21) Appl. No.: 13/532,373

(22) Filed: Jun. 25, 2012

(65) Prior Publication Data

US 2012/0263321 A1  Oct. 18, 2012

Related U.S. Application Data

(63) Continuation of application No. 12/248,458, filed on Oct. 9, 2008, now Pat. No. 8,208,660.

(60) Provisional application No. 61/091,847, filed on Aug. 26, 2008.

(51) Int. Cl.
  *H03G 3/00* (2006.01)
  *B81B 3/00* (2006.01)
  *H03G 3/30* (2006.01)
  *H04R 25/00* (2006.01)

(52) U.S. Cl.
  CPC .................................. *H03G 3/3026* (2013.01)

(58) Field of Classification Search
  USPC .................. 455/241.1; 700/94; 381/107, 321; 257/415–420
  See application file for complete search history.

(56) References Cited

U.S. PATENT DOCUMENTS

| | | | |
|---|---|---|---|
| 6,353,364 B1 | 3/2002 | Klemmer | |
| 7,463,170 B2 | 12/2008 | Kong et al. | |
| 7,515,071 B2 | 4/2009 | Kong et al. | |
| 7,912,728 B2 | 3/2011 | Kong et al. | |
| 7,949,419 B2 | 5/2011 | Kong et al. | |
| 8,208,660 B2 * | 6/2012 | Sollenberger et al. | ........ 381/107 |
| 2005/0136848 A1 | 6/2005 | Murray | |
| 2008/0130913 A1 | 6/2008 | Kong | |
| 2008/0130916 A1 | 6/2008 | Kong | |
| 2008/0133224 A1 | 6/2008 | Kong | |

* cited by examiner

*Primary Examiner* — Calvin Lee
(74) *Attorney, Agent, or Firm* — Sterne, Kessler, Goldstein & Fox P.L.L.C.

(57) ABSTRACT

In a method and system for audio level detection and control, an amplitude of an audio signal may be compared to a threshold and an attenuation applied to the audio signal may be adjusted based on the comparison. In instances that the amplitude of the audio signal is greater than or equal to the threshold the adjustment may comprise increasing a first attenuation factor until the amplitude of the audio signal is less than the threshold. The first attenuation factor may be subsequently decreased until the amplitude of the audio signal is greater than or equal to the threshold or until the first attenuation factor is equal to zero. The attenuation of the audio signal may be controlled via a digital gain circuit within the hardware audio CODEC, wherein an overall attenuation factor of the digital gain circuit is a sum of the first attenuation factor and a second attenuation factor.

20 Claims, 9 Drawing Sheets

METHOD AND SYSTEM FOR AUDIO LEVEL DETECTION AND CONTROL

CROSS-REFERENCE TO RELATED APPLICATIONS/INCORPORATION BY REFERENCE

This application is a continuation of U.S. application Ser. No. 12/248,458, filed on Oct. 9, 2008, now U.S. Pat. No. 8,208,660, issued on Jun. 26, 2012, which claims benefit to U.S. Provisional Application No. 61/091,847, filed on Aug. 26, 2008.

This application also makes reference to U.S. Provisional Patent Application Ser. No. 61/091,840 filed on Aug. 26, 2008.

Each of the above stated applications is hereby incorporated herein by reference in its entirety.

FIELD OF THE INVENTION

Certain embodiments of the invention relate to processing of audio signals. More specifically, certain embodiments of the invention relate to a method and system for audio level detection and control.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may comprise audio processing devices that provide appropriate gain, filtering, analog-to-digital conversion, and/or other processing of audio signals in an uplink direction and/or a downlink direction. In the downlink direction, an audio processing device may condition and/or process baseband audio signals from a receiver for presentation via audio output devices such as a loudspeaker and headphones. In an uplink direction, an audio processing device may process and/or condition audio signals received from an input device such as a microphone and convey the processed signals to a transmitter.

Limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for audio level detection and control, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for audio level detection and control. In various embodiments of the invention, an amplitude of an audio signal may be compared to a threshold value and an attenuation applied to the audio signal may be adjusted based on the comparison. When the amplitude of the audio signal is greater than or equal to the threshold, the adjustment may comprise increasing a first attenuation factor until the amplitude of the audio signal is less than the threshold. The first attenuation factor may be subsequently decreased until the amplitude of the audio signal is greater than or equal to the threshold or until the first attenuation factor is equal to zero. The attenuation of the audio signal may be controlled via a digital gain circuit within the hardware audio CODEC, wherein an overall attenuation factor of the digital gain circuit is a sum of the first attenuation factor and a second attenuation factor. When the audio signal is a left or right stereo channel, an attenuation factor of a second digital gain circuit may also be adjusted based on the amplitude of the audio signal. The first attenuation factor may be incrementally increased over a number of samples of the audio signal and the number of samples may be configured dynamically. In this regard, the first attenuation factor may be incremented or decremented and a size of the increment or decrement may be dynamically configured. A number of samples over which the audio signal may be adjusted may be dynamically configured. The threshold may be dynamically determined based, for example, on an output of the hardware audio codec to which the audio signal may be destined.

Figure 1:
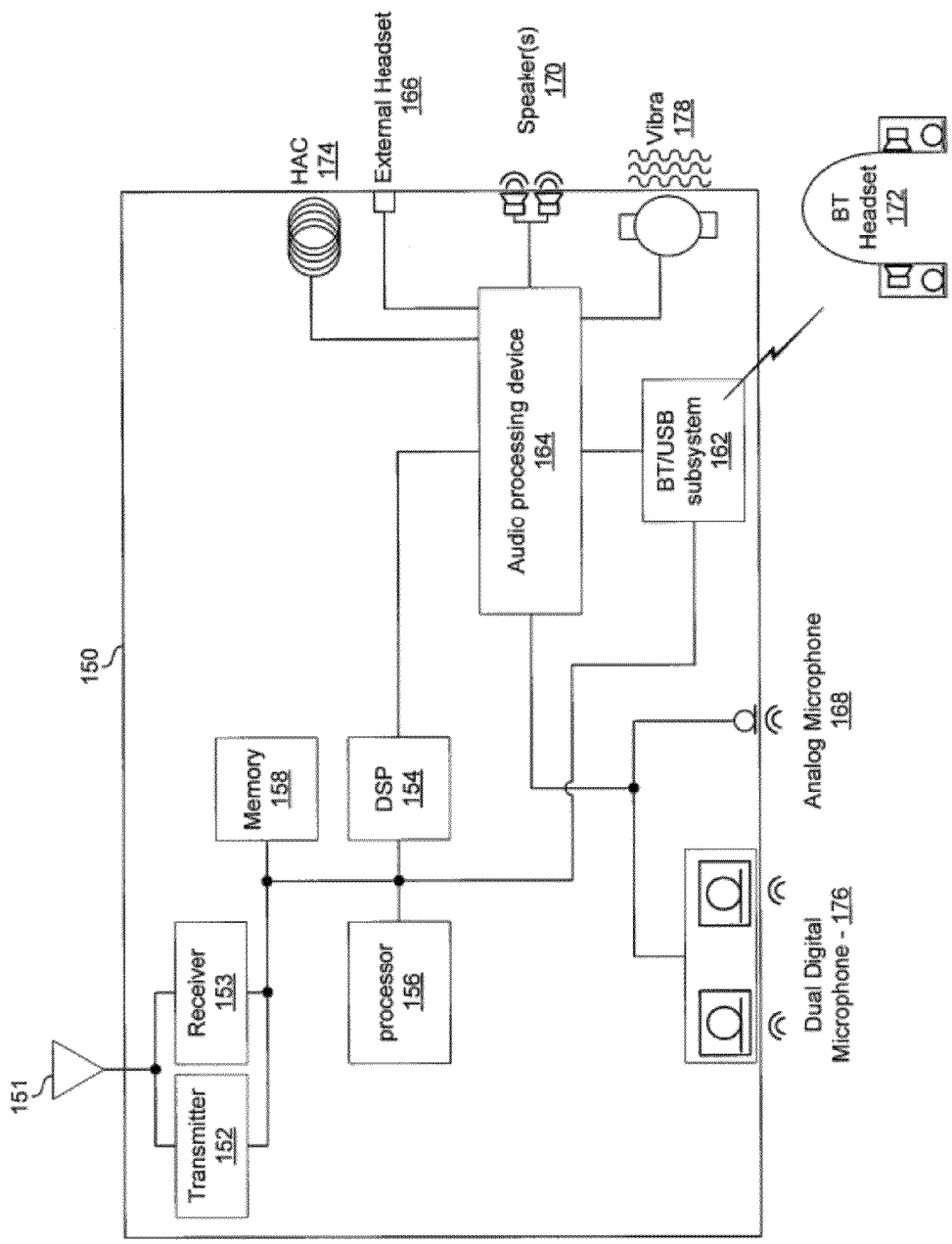
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transmitter 152, a receiver 153, a digital signal processor 154, a processor 156, a memory 158, a Bluetooth (BT) and/or Universal Serial Bus (USB) subsystem 162, an audio processing device 164, an external headset port 166, an analog microphone 168, speaker(s) 170, a Bluetooth headset 172, a hearing aid compatibility (HAC) coil 174, a dual digital microphone 176, and a vibration transducer 178. The antenna 151 may be used for reception and/or transmission of RF signals. Different wireless systems may use different antennas for transmission and reception.

The transmitter 152 may comprise suitable logic, circuitry, and/or code that may be operable to modulate and up-convert baseband signals to RF signals for transmission by one or more antennas, which may be represented generically by the antenna 151. The transmitter 152 may be operable to execute other functions, for example, filtering the baseband and/or RF signals, and/or amplifying the baseband and/or RF signals. Although a single transmitter 152 is shown, the invention is not so limited. Accordingly, there may be a plurality of transmitters and/or receivers. In this regard, the plurality of transmitters may enable the wireless system 150 to handle a plurality of wireless protocols and/or standards including cellular, wireless local area networking (WLAN), and personal area networking (PAN). In addition, the transmitter 152 may be combined with the receiver 153 and implemented as a combined transmitter and receiver (transceiver).

The receiver 153 may comprise suitable logic, circuitry, and/or code that may be operable to down-convert and demodulate received RF signals to baseband signals. The RF signals may be received by one or more antennas, which may be represented generically by the antenna 151. The receiver 153 may be operable to execute other functions, for example, filtering the baseband and/or RF signals, and/or amplifying the baseband and/or RF signals. Although a single receiver 153 is shown, the invention is not so limited. Accordingly, there may be a plurality of receivers. In this regard, the plurality of receivers may enable the wireless system 150 to handle a plurality of wireless protocols and/or standards including cellular, WLAN, and PAN. In addition, the receiver 153 may be implemented as a combined transmitter and receiver (transceiver).

The DSP 154 may comprise suitable logic, circuitry, and/or code that may be operable to process audio signals. In various embodiments of the invention, the DSP 154 may encode, decode, modulate, demodulate, encrypt, and/or decrypt audio signals. In this regard, the DSP 154 may be operable to perform computationally intensive processing of audio signals.

The processor 156 may comprise suitable logic, circuitry, and/or code that may be operable to configure and/or control one or more portions of the system 150, control data transfers between portions of the system 150, and/or otherwise process data. Control and/or data information may be transferred between the processor 156 and one or more of the transmitter 152, the receiver 153, the DSP 154, the memory 158, the audio processing device 164, and the BT and/or USB subsystem 162. The processor 156 may be utilized to update and/or modify programmable parameters and/or values in one or more of the transmitter 152, the receiver 153, the DSP 154, the memory 158, the audio processing device 164, and the BT and/or USB subsystem 162. In this regard, a portion of the programmable parameters may be stored in the system memory 158. The processor 156 may be any suitable processor or controller. For example, the processor may be a reduced instruction set computing (RISC) microprocessor such as an advanced RISC machine (ARM), advanced virtual RISC (AVR), microprocessor without interlocked pipeline stages (MIPS), or programmable intelligent controller (PIC).

The system memory 158 may comprise suitable logic, circuitry, and/or code that may be operable to store a plurality of control and/or data information, including parameters needed to configure one or more of the transmitter 152, the receiver 153, the DSP 154, and/or the audio processing device 164. The system memory 158 may store at least a portion of the programmable parameters that may be manipulated by the processor 156.

In an exemplary embodiment of the invention, the DSP 154 and processor 156 may exchange audio data and control information via the memory 158. For example, the processor 156 may write encoded audio data, such as MP3 or AAC audio, to the memory 158 and the memory may pass the encoded audio data to the DSP 154. Accordingly, the DSP 154 may decode the data and write pulse-code modulated (PCM) audio back into the shared memory for the processor 156 to access and/or to be delivered to the audio processing device 164.

The BT and/or USB subsystem 162 may comprise suitable circuitry, logic, and/or code that may be operable to transmit and receive Bluetooth and/or Universal Serial Bus (USB) signals. The BT and/or USB subsystem 162 may be operable to up-convert, down-convert, modulate, demodulate, and/or otherwise process BT and/or USB signals. In this regard, the BT and/or USB subsystem 162 may handle reception and/or transmission of BT and/or USB signals via a wireless communication medium and/or handle reception and/or transmission of USB signals via a wireline communication medium. Information and/or data received via a BT and/or USB connection may be communicated between the BT and/or USB subsystem 162 and one or more of the transmitter 152, the receiver 153, the DSP 154, the processor 156, the memory 158, and the audio processing device 164. For example, the BT and/or USB subsystem 162 may extract audio from a received BT and/or USB signal and may convey the audio to other portions of the wireless system 150 via an inter-IC sound ($I^2S$) bus. Information and/or data may be communicated from one or more of the transmitter 152, the receiver 153, the DSP 154, the processor 156, the memory 158, and the audio processing device 164 to the BT and/or USB subsystem 162 for transmission over a BT and/or USB connection. For example, audio signals may be received from other portions of the wireless system 150 via an I2S bus and the audio signal may be transmitted via a BT and/or USB connection. Additionally, control and/or feedback information may be communicated between the BT and/or USB subsystem 162 and one or more of the transmitter 152, the receiver 153, the DSP 154, the processor 156, the memory 158, and the audio processing device 164.

The audio processing device 164 may comprise suitable circuitry, logic, and/or code that may be operable to process audio signals received from and/or communicated to input and/or output devices. The input devices may be within or communicatively coupled to the wireless device 150, and may comprise, for example, the analog microphone 168, the stereo speakers 170, the Bluetooth headset 172, the hearing aid compatible (HAC) coil 174, the dual digital microphone 176, and the vibration transducer 178. The audio processing device 164 may up-sample and/or down-sample audio signals to one or more desired sample rates for communication to an audio output device, the DSP 154, and/or the BT and/or USB subsystem 162. In this regard, the audio processing device 164 may also be enabled to handle a plurality of data sampling rate inputs. For example, the audio processing device 164 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio processing device 164 may be enabled to handle a plurality of digital audio inputs of various resolutions, such as 16 or 18-bit resolution, for example. The audio processing device 164 may support mixing of a plurality of audio sources. For example, the audio processing device 164 may support audio sources such as general audio, polyphonic ringer, I²S FM audio, vibration driving signals, and voice. In an exemplary embodiment of the invention, the general audio and polyphonic ringer sources may support the plurality of sampling rates that the audio processing device 164 may be enabled to accept, while the voice source may support a portion of the plurality of sampling rates, such as 8 kHz and 16 kHz.

The audio processing device 164 may utilize a programmable infinite impulse response (IIR) filter and/or a programmable finite impulse response (FIR) filter for at least a portion of the audio sources to compensate for passband amplitude and phase fluctuation for different input and/or output devices. In this regard, filter coefficients may be configured or programmed dynamically based on operations. Moreover, filter coefficients may all be switched in one-shot or may be switched sequentially, for example. The audio processing device 164 may also utilize a modulator, such as a Delta-Sigma (ΔΣ) modulator, for example, to code digital output signals for analog processing. The audio processing device 164 may be referred to, for example, as an audio coding and/or decoding device or CODEC. In various embodiments of the invention, the audio processing device 164 may be implemented in dedicated hardware.

The external headset port 166 may comprise a physical connection for an external headset to be communicatively coupled to the wireless system 150. The headset may, for example, be an analog headset comprising a microphone and a pair of stereo transducers. Alternatively, the headset may be a digital headset which may utilize a protocol such as USB for communicating audio information.

The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The one or more speakers 170 may be operable to generate acoustic waves from electrical signals received from the audio processing device 164. In an exemplary embodiment of the invention, there may be a pair of speakers which may be operable to output acoustic waves corresponding to, for example, left and right stereo channels.

The Bluetooth headset 172 may comprise a wireless headset that may be communicatively coupled to the wireless system 150 via the BT and/or USB subsystem 162. In this manner, the wireless system 150 may be operated in a hands-free mode, for example.

The HAC coil 174 may comprise suitable circuitry, logic, and/or code that may enable communication between the wireless device 150 and a hearing aid, for example. In this regard, audio signals may be magnetically coupled from the HAC coil 174 to a coil in a user's hearing aid.

The dual digital microphone 176 may comprise suitable circuitry, logic, and/or code that may detect sound waves and convert them to electrical signals. The electrical signals generated by the dual digital microphone 176 may comprise digital signals, and thus may not require analog to digital conversion prior to digital processing in the audio processing device 164.

The vibration transducer 178 may comprise suitable circuitry, logic, and/or code that may be operable to notify a user of events on the wireless device 150 such as calendar reminders, a low battery notification, a received signal strength notification, an incoming call, and an incoming message without the use of sound. Aspects of the invention may enable the vibration transducer 178 to generate vibrations that may be in synch with, for example, audio signals such as speech, music, ringtones, and/or continuous wave (CW) tones.

In operation, audio signals from the receiver 153, the processor 156, and/or the memory 158 may be conveyed to the DSP 154. The DSP 154 may process the signals to generate output baseband audio signals to the audio processing device 164. Additionally, baseband audio signals may be conveyed from the BT and/or USB subsystem 162, the analog microphone 168, and/or the digital microphone 176, to the audio processing device 164.

The audio processing device 164 may process and/or condition one or more of the baseband audio signals to make them suitable for conveyance to the one or more speakers 170, the headset 166, the HAC 174, the vibration transducer 178, the transmitter 152, and/or the BT and/or USB subsystem 162. In this regard, in one embodiment of the invention, the processing and/or conditioning of audio signals for conveyance to an output device may comprise controlling audio signal levels to prevent over-driving an audio output device. Accordingly, audio signal levels may be detected and an attenuation to be applied to the signals may be determined based on the measured signals levels. The attenuation may be performed by a digital gain block with a configurable attenuation factor. In instances that measured audio signal levels are above a threshold, the attenuation factor of the digital gain block may be increased and when the signal levels fall below the threshold, the attenuation factor of the digital gain block may be decreased. Increasing the attenuation may be referred to as gain attack and decreasing the attenuation factor may be referred to as gain decay. Adjustments to the attenuation factor may be applied incrementally over one or more audio samples. In this manner, audible clicking or popping, for example, which may result from rapid and/or large audio signal level changes, may be prevented by ramping up and/or ramping down the attenuation factor until a target attenuation may be achieved.

Figure 2A:
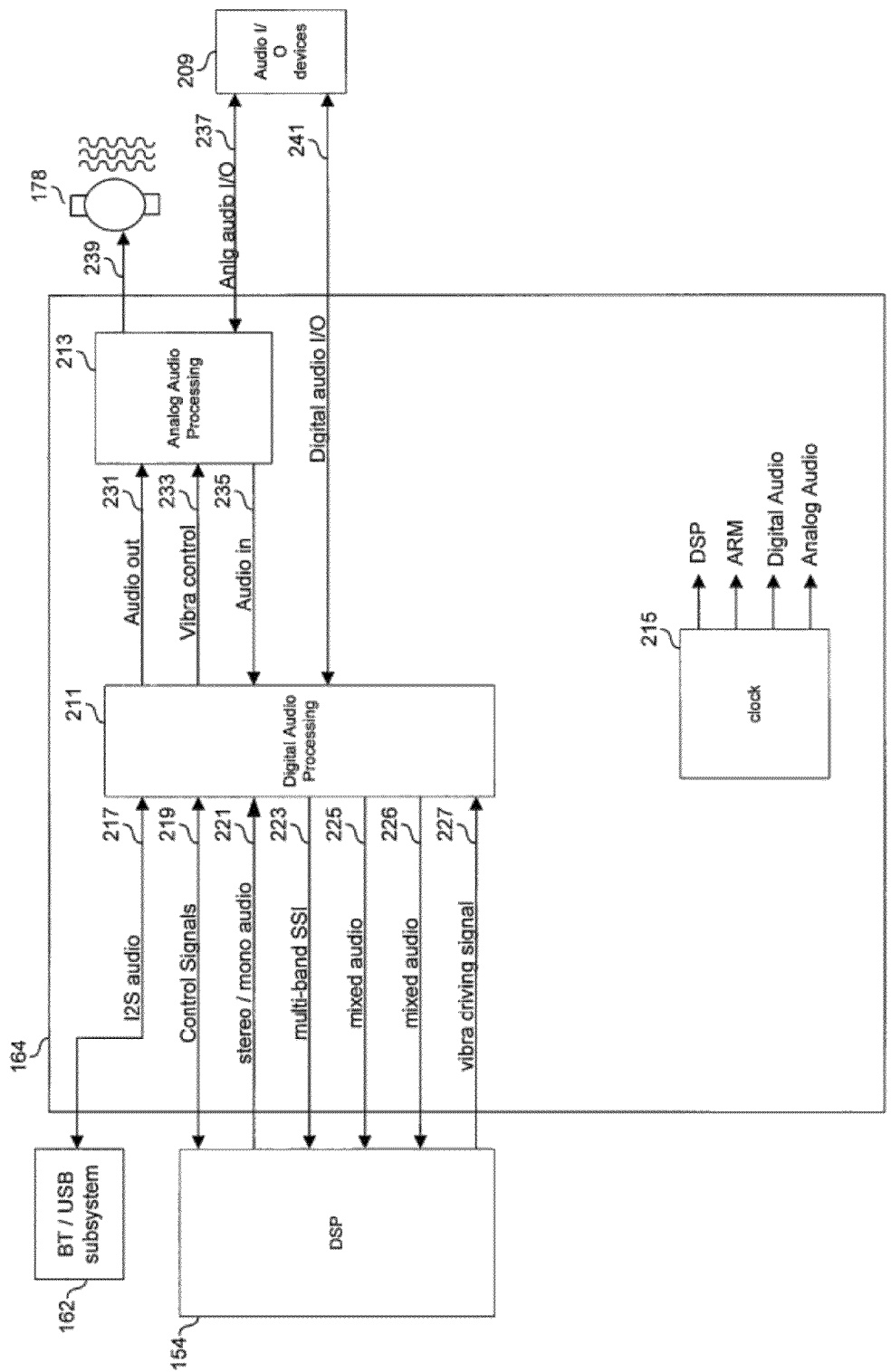
FIG. 2A is a block diagram illustrating an exemplary audio processing device, in accordance with an embodiment of the invention.

FIG. 2A is a block diagram illustrating an exemplary audio processing device, in accordance with an embodiment of the invention. Referring to FIG. 2A, there is shown the DSP 154, the BT and/or USB subsystem 162, the audio processing device 164, and audio input and/or output devices 209. The audio input and/or output devices 209 may comprise one or more devices such as the external headset port 166, the analog microphone 168, the speakers 170, the Bluetooth headset 172, the hearing aid compatibility (HAC) coil 174, the dual digital microphone 176, and the vibration transducer 178 described with respect to FIG. 1. The DSP 154 and the BT and/or USB subsystem 162 may be as described with respect to FIG. 1. The audio processing device 164 may be as described with respect to FIG. 1 and may comprise a digital portion 211, an analog portion 213, and a clock 215.

The digital portion 211 may comprise suitable logic, circuitry, and/or code that may enable processing audio signals in the digital domain. In this regard, the digital portion 211 may be operable to filter, buffer, up-sample, down-sample, apply a digital gain or attenuation to, route, and/or otherwise condition digital audio signals. Additional details of the digital portion 211 are described below with respect to FIGS. 2B, 3A, 3B, 3C, and 3D.

The analog portion 213 may comprise suitable logic, circuitry, and/or code that may enable conversion of digital audio signals to an analog representation and amplifying and/or buffering the analog signals for driving audio output devices. Additional details of the analog portion 213 are described below with respect to FIG. 2B.

The clock 215 may comprise suitable logic, circuitry, and/or code that may be operable to generate one or more periodic signals. The clock 215 may, for example, comprise one or more crystal oscillators, phase locked loops (PLLs), and/or direct digital frequency synthesizers (DDFS). The clock 215 may output a plurality of signals each with a distinct frequency and/or phase. The signals output by the clock 215 may be conveyed to one or more of the digital portion 211, the analog portion 213, the DSP 154, the memory 158, and/or the processor 156.

In various exemplary embodiments of the invention, one or more audio signals 217 may be communicated between the digital portion 211 and the BT and/or USB subsystem 162 via an inter-IC sound ($I^2S$) bus. Each of the audio signals 217 may be a monaural channel, a left stereo channel, or a right stereo channel. In an exemplary embodiment of the invention, the BT and/or USB subsystem 162 may be enabled to receive and/or process audio broadcasts, and thus, two signals 217 comprising left and right channel audio may be conveyed to the digital portion 211 via an $I^2S$ bus. In this regard, exemplary audio broadcasts may comprise FM stereo, "HD radio", DAB, DAB+, and satellite radio broadcasts.

In various exemplary embodiments of the invention, one or more output audio signals 231, vibration control 233, and input audio signals 235 may be communicated between the digital portion 211 and the analog portion 213.

The output audio signals 231 may each comprise one or more digital audio signals which have been suitably processed and/or conditioned by the digital portion 211 for output via one or more of the audio output devices 209. Each of the audio signals 231 may be a monaural channel, a left stereo channel, or a right stereo channel. Each of the output audio signals 231 may be converted to an analog representation and amplified by the analog portion 213.

The input audio signals 235 and 241 from an audio input device 209 may each comprise one or more digital audio signals to be processed by the digital portion 211. The input audio signals 235 and/or 241 may comprise monaural and/or stereo audio data which the digital portion 211 may process for conveyance to the DSP 154 and subsequent transmission to a remote wireless device. The input audio signals 235 and/or 241 may comprise monaural and/or stereo audio data which the digital portion 211 may process in a "loopback" path for conveyance to one or more audio output devices 209.

The vibration control signal 233 may be a pulse width modulated square wave that may, after being amplified by the analog portion 213, control vibration of the vibration transducer 178. In various exemplary embodiments of the invention, spectral shaping techniques may be applied in the pulse width modulation function to reduce noise in the audible band.

In various exemplary embodiments of the invention, one or more control signals 219, one or more audio signals 221, one or more SSI signals 223, one or more mixed audio signals 225 and/or 226, and one or more signals 227 for driving a vibration transducer may be communicated between the DSP 154 and the digital portion 211. Monaural and/or stereo audio data may be extracted from RF signals received by the receiver 153 and processed by the DSP block 154 before being conveyed to the digital portion 211 of the processing device 164. One or more signals communicated between the DSP 154 and the digital portion 211 may be buffered. For example, voice signals may not be buffered while music and/or ringtone signals may be written to a first-in-first-out (FIFO) buffer by the DSP 154 and then fetched from the FIFO by the digital portion 211.

The one or more control signals 219 may be utilized to configure various operations of the digital portion 211 based, for example, on a resolution and/or sampling rate of signals being output by the DSP 154. In various embodiments of the invention, one or more control registers for the digital portion 211 may reside in the DSP 154. In various embodiments of the invention, the control signals 219 may comprise one or more interrupt signals.

The audio signals 221 may each comprise, for example, voice data, music data, or ringtone data. Each audio signal 221 may be monaural signal, a left stereo channel, or a right stereo channel. The digital portion 211 may condition and/or process the audio signals 221 for conveyance to one or more audio output devices and/or uplink paths. In various embodiments of the invention, the resolution and/or sample rate of the audio signals 221 may vary. Exemplary resolutions may comprise 16-bit and 18-bit resolution. Exemplary sample rates may comprise 8 kHz, 11.05 kHz, 12 kHz, 16 kHz, 22.05 kHz, 24 kHz, 32 kHz, 44.1 kHz, and 48 kHz.

The signal strength indicator (SSI) signals 223 may comprise one or more feedback signals from the digital portion 211 to the DSP 154. The SSI signals 223 may provide an indication of signal strength of one or more frequency bands of one or more audio signals 221, 225, and/or 226. The SSI signals 223 may, for example, be utilized by the DSP 154, the processor 156, the memory 158, or a combination thereof to control a digital gain factor applied to each sub-band of one or more audio signals 221, 225, and/or 226. In various embodiments of the invention, the SSI signals 223 may be utilized for audio visualizations.

The signal 227 may comprise audio data utilized to control a vibration transducer 178. The signal 227 may comprise, for example, CW tone data, voice data, music data, or ringtone data. Characteristics such as intensity of vibration, a pattern in which vibration is started and stopped, a frequency at which vibration may be started and/or stopped, and/or a duration of a vibration or sequence of vibrations may be controlled based on the signal 227.

The one or more mixed audio signals 225 and the one or more mixed audio signals 226 may be output by the digital portion 211 to the DSP 154. The mixed audio signals 225 may each be a composite signal comprising information from one or more monaural signals and/or stereo audio signals. Similarly, the mixed audio signals 226 may each be a composite signal comprising information from one or more monaural signals and/or stereo audio signals. In this regard, one or more of the audio signals 221, one or more of the input audio signals 235, one or more of the input audio signals 241, and/or one or more of the audio signals 217 may be mixed together. Each of the audio signals 221, 235, 241, and 217 may be, for example, amplified, attenuated, band limited, up-converted, down-converted or otherwise processed and/or conditioned prior to mixing. The mixed audio signals 225 may be part of and/or coupled to an uplink path. For example, the signals 225 may be processed by the DSP 154 and transmitted, via the BT and/or USB subsystem 162, to a remote wireless system. Similarly, the mixed audio signal) 226 may be part of and/or coupled to an uplink path. For example, the signals 226 may be processed by the DSP 154 and transmitted, via the transmitter 152, to a far-end communication partner or a remote wireless system.

Figure 2B:
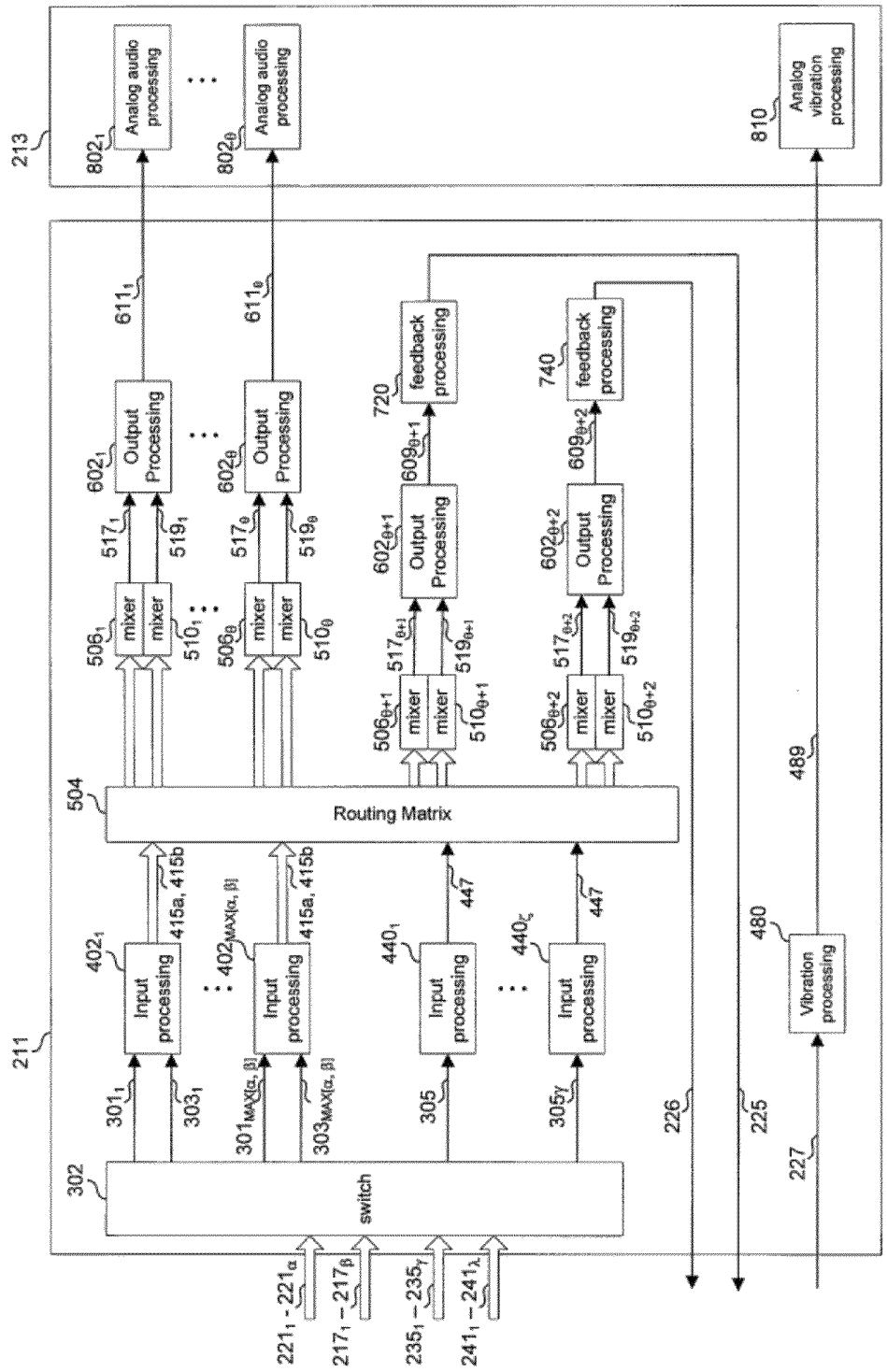
FIG. 2B is a block diagram illustrating exemplary digital processing and analog processing portions of an audio processing device, in accordance with an embodiment of the invention.

In operation, one or more baseband audio signals 217, 221, 235, and/or 241 may be conveyed to the audio processing device 164 from one or more of the DSP 154, the BT and/or USB subsystem 162, and the input and/or output devices 209. The digital portion 211 of the audio processing device 164 may select which baseband audio signals 221 to process. Each of the selected audio signals may be processed based on factors such as whether the signal is one of a pair of stereo signals or is a monaural signal; whether the signal comprises voice, music, or ringtone data; a resolution of the signal; and a sample rate of the signal. Selected audio signals may be processed in an input processing path comprising one or more input audio processing blocks 402 and/or 440 (FIG. 2B). The input audio processing path may be operable to process and/or condition audio signals based on a source and/or various characteristics of the audio signal. Subsequently, audio signals may be mapped from one or more input processing paths to one or more output processing paths. The output processing path may comprise one or more mixers 506 and/or 510 (FIG. 2B), output audio processing blocks 602 (FIG. 2B), feedback audio processing block 720 (FIG. 2B), and/or feedback processing block 740 (FIG. 2B). The output processing path may condition signals based on one or more output devices 209 and/or uplink paths to which the audio signals may be conveyed. In this regard, conditioning of audio signals by the output processing path may comprise adjusting an attenuation factor of a digital gain block in order to maintain levels of signals 225, 226, 231, and/or 241 between determined thresholds.

FIG. 2B is a block diagram illustrating exemplary digital processing and analog processing portions of an audio processing device, in accordance with an embodiment of the invention. Referring to FIG. 2B, there is shown a digital portion 211 and an analog portion 213.

The digital portion 211 may comprise a switching element 302, a plurality of input audio processing blocks 402, a plurality of input audio processing blocks 440, a digital vibration processing block 480, a routing matrix 504, a plurality of mixers 506 and 510, a plurality of output audio processing blocks 602, a feedback audio processing block 720, and a feedback audio processing block 740.

The switching element 302 may be operable to route one or more of the signals $221_1 \ldots 221_\alpha$ (collectively referred to herein as signals 221), $217_1 \ldots 217_\beta$ (collectively referred to herein as signals 217), $235_1 \ldots 235_\gamma$ (collectively referred to herein as signals 235), and/or $241_1 \ldots 241_\lambda$ (collectively referred to herein as signals 241) from the DSP 154, BT and/or USB subsystem 162, and audio input devices 209 to the digital portion 211, where $\alpha, \beta, \gamma$ and $\lambda$ are integers greater than or equal to 1. Which signals 221, 217, 235, and/or 241 are routed to one or more input audio processing blocks 402 and/or 440 may be determined based on one or more control signals received from, for example, the DSP 154, the processor 156, and/or the BT and/or USB subsystem 162. In this regard, the switching element 302 may be configured dynamically and/or in real-time so as to provide processing whenever it may be required.

Each of the input audio processing blocks 402 may comprise suitable logic, circuitry, and/or code that may be operable to condition monaural or stereo input audio signals. Processing of an audio signal by each of the input audio processing blocks 402 may be based on a type of audio content in the signal, a source of the audio signal, and/or a sample rate of the audio signal. Each of the input audio processing blocks 402 may be operable to buffer an audio signal 301 and/or 303. One or more of the input audio processing blocks 402 may be operable to control whether audio data is processed as a left stereo channel, a right stereo channel, or a monaural signal. Each of the input audio processing blocks 402 may be operable to measure strength of one or more audio signals 301 and/or 303 and generate one or more feedback signals corresponding to the measured strength. Each of the input audio processing blocks 402 may be operable to filter the one or more audio signals 301 and/or 303, and/or up-sample and/or down-sample the audio signals 301 and/or 303. Each of the input audio processing blocks 402 may be operable to adjust signal levels of the signals 415a and 415b. In various embodiments of the invention, one or more of the input audio processing blocks 402 may be configured via one or more control signals received from, for example, the DSP 154, the processor 156, and/or the BT and/or USB subsystem 162. In this regard, the input audio processing blocks 402 may be configured dynamically and/or in real-time so as to provide processing whenever it may be required.

Each of the input audio processing blocks 440 may comprise suitable logic, circuitry, and/or code that may be operable to condition monaural input audio signals. Processing of an audio signal 305 by each of the input audio processing blocks 440 may be based on a type of audio content in the signal 305, a source of the audio signal 305, and/or a sample rate of the audio signal 305. Each of the input audio processing blocks 440 may be operable to buffer an audio signal 305, filter the audio signal 305, and/or up-sample or down-sample the audio signal 305. Each of the input audio processing blocks 440 may be operable to adjust signal levels of the signal 447. In various embodiments of the invention, one or more of the input audio processing blocks 440 may be configured via one or more control signals received from, for example, the DSP 154, the processor 156, and/or the BT and/or USB subsystem 162. In this regard, the input audio processing blocks 440 may be configured dynamically and/or in real-time so as to provide processing whenever it may be required.

The digital vibration processing block 480 may comprise suitable logic, circuitry, and/or code that may be operable to process and/or condition one or more of the baseband audio signals to generate one or more signals 489 for controlling the vibration transducer 178. In this regard, the digital vibration processing block 480 may be operable to control vibrations based on an audio signal. In an exemplary embodiment of the invention, various characteristics such as intensity of vibration, a pattern in which vibration is started and stopped, a frequency at which vibration is started and stopped, and/or duration of a vibration or sequence of vibrations may be controlled based on an audio signal input to the digital vibration processing block 480. The digital vibration processing block 480 may be configured via one or more control signals received from, for example, the DSP 154, the processor 156, and/or the BT and/or USB subsystem 162. In this regard, the digital vibration processing block 480 may be configured dynamically and/or in real-time so as to provide processing whenever it may be required.

The routing matrix 504 may comprise suitable logic, circuitry, and/or code that may be operable to route each of the signals 415 and 447 to one or more of the mixers 506 and/or 510. The routing matrix 504 may be configured via one or more control signals from, for example, the processor 156, the DSP 154, and/or the memory 158. Moreover, configuration of the routing matrix 504 may occur dynamically and/or in real-time so as to provide processing whenever it may be required. In various embodiments of the invention, the routing matrix 504 may comprise one or more multiplexers or similar switching elements. Routing of each input signal 415 and/or 447 may depend, at least in part, on an output device 209 and/or uplink path for which each signal 415 and 447 may be destined. In this regard, the routing and re-routing of signals between inputs and outputs of the audio processing device 164 may occur in real-time.

Routing of each input signal 415 and/or 447 may be independent of the routing of other input signals 415 and 447, independent of the source of each signal 415 and/or 447, and independent of whether each signal 415 and/or 447 is a stereo channel or a monaural channel. Thus, upstream from the routing matrix 504 audio signals may be processed according to an input of the processing device 164 on which the audio signals where received and downstream from the routing matrix 504 audio signals may be processed based on an output of the processing device 164 for which the signals are destined. In this manner, the processing device 164 may provide flexibility in routing audio signals of various types from various sources to one or more audio output devices and/or uplink paths. Upstream from the routing matrix 504 may comprise the input audio processing blocks 402 and 440. Downstream from the routing matrix 504 may comprise the mixers 506 and 510, the output audio processing blocks 602, the feedback audio processing block 720, and the feedback audio processing block 740.

The mixers 506 and 510 may each comprise suitable logic, circuitry, and/or code that may be operable to combine audio signals into a composite audio signal. Each mixer 506 may combine up to $\eta$ audio signals to generate a composite audio signal 517. Similarly each mixer 510 may combine up to $\eta$ audio signals to generate a composite audio signal 519. In various embodiments of the invention, each signal $517_1 \ldots 517_{\theta+2}$, may be a left stereo channel and each signal $519_1 \ldots 519_{\theta+2}$, may be a right stereo channel. In an exemplary embodiment of the invention, the mixers 506 and 510 may output up to $\theta+2$ stereo signals or up to $2(\theta+2)$ monaural signals to a number, $\theta$, of analog audio processing blocks 802, the feedback audio processing block 720, and the feedback audio processing block 740 via the output audio processing blocks 602. The mixers 506 and 510 may be configured via one or more control signals from, for example, the processor 156, the DSP 154, and/or the memory 158. In this regard, the mixers 506 and/or 510 may be configured dynamically and/or in real-time so as to provide processing whenever it may be required.

Each output audio processing blocks 602 may comprise suitable logic, circuitry, and/or code that may be operable to process audio signals for conveyance to one or more analog audio processing blocks 802, the feedback audio processing block 720, and the feedback audio processing block 740. Details of an exemplary output audio processing block 602 are described with respect to FIGS. 3A-3D.

The feedback audio processing block 720 may comprise suitable logic, circuitry, and/or code that may be operable to process and/or condition one or more of the baseband audio signals to generate one or more signals 225. In various embodiments of the invention, one or more signals 225 may be conveyed to an uplink signal path via the DSP 154 and/or the BT and/or USB subsystem 162. In this regard, the audio signal(s) 225 may comprise voice, music, and/or ringtone data which may be communicated to a remote wireless device utilizing BT and/or USB protocols. In various embodiments of the invention, one or more signals 225 may be conveyed to an output device such as the BT headset 172 via the BT and/or USB subsystem 162. The feedback audio processing block 720 may be operable to up-sample and/or down-sample audio signals, adjust signal levels of the output signal 225, and/or buffer audio signals. The feedback audio processing block 720 may be configured via one or more control signals received from, for example, the DSP 154, the processor 156, and/or the BT and/or USB subsystem 162. In this regard, the feedback audio processing block 720 may be configured dynamically and/or in real-time so as to provide processing whenever it may be required.

The feedback audio processing block 740 may comprise suitable logic, circuitry, and/or code that may be operable to process and/or condition one or more baseband audio signals to generate one or more signals 226 which may be conveyed to an uplink signal path via the DSP 154 and/or transmitter 152. In this regard, the audio signal 226 may comprise voice, music, and/or ringtone data which may be communicated to a remote wireless device utilizing, for example, cellular, WLAN, PAN, and/or broadcast audio protocols. The feedback audio processing block 740 may be operable to up-sample and/or down-sample audio signals. The feedback audio processing block 740 may be configured via one or more control signals received from, for example, the DSP 154, the processor 156, and/or the BT and/or USB subsystem 162. In this regard, the feedback audio processing block 740 may be configured dynamically and/or in real-time so as to provide processing whenever it may be required.

Each of the analog audio processing blocks 802 may comprise suitable logic, circuitry, and/or code that may be operable to condition audio signals for driving an audio output device 209. Each analog audio processing block 802 may be operable to convert a digital audio signal to an analog representation. Each analog audio processing block 802 may be operable to buffer and/or amplify analog audio signals for driving an audio output device 209. The analog audio processing blocks 802 may be configured via one or more control signals which may be received from, for example, the DSP 154, the processor 156, and/or the BT and/or USB subsystem 162. In this regard, the analog audio processing blocks 802 may be configured dynamically and/or in real-time so as to provide processing whenever it may be required.

The analog vibration processing block 810 may comprise suitable logic, circuitry, and/or code that may be operable to buffer and/or amplify the signal 489 for driving the vibration transducer 178. In this regard, driving the vibration transducer 178 may require more current than the digital vibration processing block 480 may be able to output and thus the analog vibration processing block 810 may provide increased output current for driving the vibration transducer 178. The analog vibration processing block 810 may be configured via one or more control signals received from, for example, the DSP 154, the processor 156, and/or the BT and/or USB subsystem 162. In this regard, the analog vibration processing block 810 may be configured dynamically and/or in real-time so as to provide processing whenever it may be required.

In operation, the switching element 302 may select one or more audio signals to be routed to one or more of the input audio processing blocks 402 and/or the input audio processing blocks 440. Each of the input audio processing blocks 402 and/or 440 may condition audio signals and convey them to the routing matrix 504. The routing matrix 504 may route the audio signals to one or more mixers 506 and/or 510. Each of the mixers 506 and/or 510 may be operable to mix together one or more audio signals into a composite audio signal 517 and/or 519. The signals 517 and/or 519 may each be conveyed to an output audio processing block 602. Each of the output audio processing blocks 602 may condition audio signals for conveyance to an analog audio processing block 802, the feedback audio processing block 720, or the feedback audio processing block 740. The signals $611_1, \ldots, 611_\theta$ may each be conveyed to an analog processing block 802 which may convert the signals $611_1, \ldots, 611_\theta$ to an analog representation and buffer and/or amplify the analog audio signal to drive an audio output device 209. The signal $609_{\theta+1}$ may be conveyed to the feedback audio processing block 720 which may process and/or condition the signal $609_{\theta+1}$ for transmission to a remote wireless device. The signal $609_{\theta+2}$ may be conveyed to the feedback audio processing block 740 which may condition the signal $609_{\theta+2}$ for transmission to a remote wireless device. Signal levels of the signal 609 and/or 611 output by each of the output audio processing blocks 602 may be controlled to prevent over-driving an audio output device 209 or an uplink path. Additional details of the output audio processing block 602 are described below with respect to FIGS. 3A-3D.

Figure 3A:
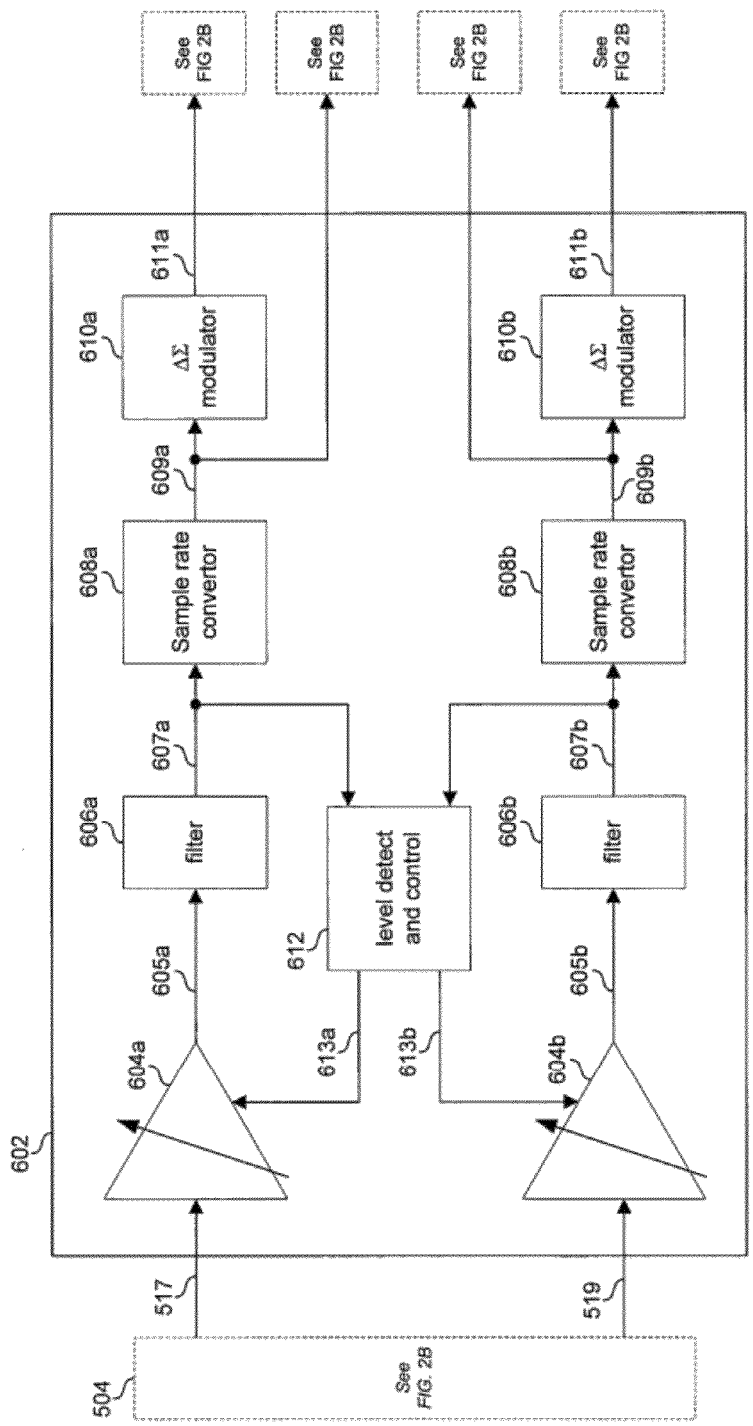
FIG. 3A is a block diagram illustrating processing audio signals for conveyance to an audio output device and/or an uplink path, in accordance with an embodiment of the invention.

FIG. 3A is a block diagram illustrating processing audio signals for conveyance to an audio output device and/or an uplink path, in accordance with an embodiment of the invention. Referring to FIG. 3A, the output audio processing block 602 may comprise digital gain blocks 604a and 604b, filters 606a and 606b, sample rate converters 608a and 608b, ΔΣ modulators 610a and 610b, and level control block 612. In an exemplary embodiment of the invention, the digital portion 211 may comprise a number of output audio processing blocks 602 equal to the number of the signals 517 and 519. In this regard, the number of output audio processing blocks 602 may be equal to θ+2.

The digital gain blocks 604a and 604b may each comprise suitable logic, circuitry, and/or code that may be operable to adjust an amplitude of digital audio signals 517 and 519. In this regard, the signals 605a and 605b may be scaled versions of the signals 517 and 519, respectively. The digital gain blocks 604a and 604b may be configured, dynamically and/or in real-time, via one or more control signals from, for example, the processor 156, the DSP 154, the memory 158, and/or the level detect and control block 612. In this regard, an attenuation factor 613a of the digital gain block 604a may be controlled based on a signal strength measurement of the signal 607a by the level control block 612. Similarly, an attenuation factor 613b of the digital gain block 604b may be configured based on a signal strength measurement of the signal 607b by the level control block 612.

The filters 606a and 606b may each comprise suitable logic, circuitry, and/or code that may be operable to attenuate undesired frequencies to a greater extent than desired frequencies and/or to compensate for the non-ideal frequency responses of an output device 209 to which the mixed signals 605a and 605b are destined. The filters 606a and 606b may comprise, for example, a finite impulse response (FIR) filter and/or an infinite impulse response filter (IIR). The filters 606a and 606b may be configured via one or more control signals from, for example, the processor 156, the DSP 154, and/or the memory 158. In this regard, filters 606a and 606b may be configured dynamically and/or real-time.

The sample rate converters 608a and 608b may each comprise suitable logic, circuitry, and/or code that may be operable to up-sample the signal 607a and 607b, respectively. In an exemplary embodiment of the invention, sample rate converters 608a and 608b may be operable to up-sample audio signals to about 6.5 MHz.

The ΔΣ modulators 610a and 610b may comprise suitable logic, circuitry, and/or code that may be operable to over-sample the signals 609a and 609b, respectively, in order to improve noise characteristics of audio signals conveyed to the analog audio processing block 802. The ΔΣ modulators 610a and 610b may be configured via one or more control signals from, for example, the processor 156, the DSP 154, and/or the memory 158. In this regard, ΔΣ modulators 610a and 610b may be configured dynamically and/or real-time.

The level control block 612 may comprise suitable logic, circuitry, and/or code that may be operable to adjust a gain of the gain blocks 604a and/or 604b based on signal strength of the signals 607a and/or 607b. The level control block 612 may be configured via one or more control signals from, for example, the processor 156, the DSP 154, and/or the memory 158. In this regard, the level control block 612 may be configured dynamically and/or real-time so as to provide processing whenever it may be required. The level control block 612 may provide an attenuation factor 613a to the digital gain block 604a and an attenuation factor 613b to the digital gain block 604b. The level control block 612 may operate in combination with the signals 223 described with respect to FIG. 2A for maintaining output signals level to protect against overdriving an output device and/or uplink path. In this regard, the signals 223 may provide a slower, sub-band level control while the signals 613a and 613b may provide a rapid, full-band level control. Additional details of the level control block 612 are described below with respect to FIGS. 3B-3D.

The output audio processing block 602 may process and/or condition audio signals based on an output of the processing device 164 to which the signals may be conveyed. In this regard, one or more of the digital gain blocks 604a and 604b, the filters 606a and 606b, the sample rate converters 608a and 608b, the ΔΣ modulators 610a and 610b, and the level control block 612 may be configured based on whether the signals 609a and 609b or 611a and 611b may be communicatively coupled to the feedback audio processing block 720, the feedback audio processing block 740, or to an output device 209 via an analog output processing block 802. The output audio processing block 602 may be configured via one or more control signals received from, for example, the DSP 154, the processor 156, and/or the BT and/or USB subsystem 162. In this regard, the output audio processing block 602 may be configured dynamically and/or real-time so as to provide processing whenever it may be required.

In operation, the level control block 612 may adjust an overall attenuation factor of the digital gain blocks 604a and 604b based on signal strength of the signals 607a and 607b, respectively. The outputs 605a and 605b of the digital gain blocks may subsequently be filtered, up-sampled, and ΔΣ modulated before being conveyed to the output device 209 via an analog output processing block 802. In instances that measured signal levels are below a threshold, the attenuation factors 613a and/or 613b may be decreased. Conversely, in instances that measured signal levels are above a threshold, the attenuation factors 613a and/or 613b may be increased. In this manner, signals 237 and/or 241 conveyed to an output device 209 and/or signals 225 and/or 226 conveyed to an uplink path and/or output device may be maintained within determined limits.

Figure 3B:
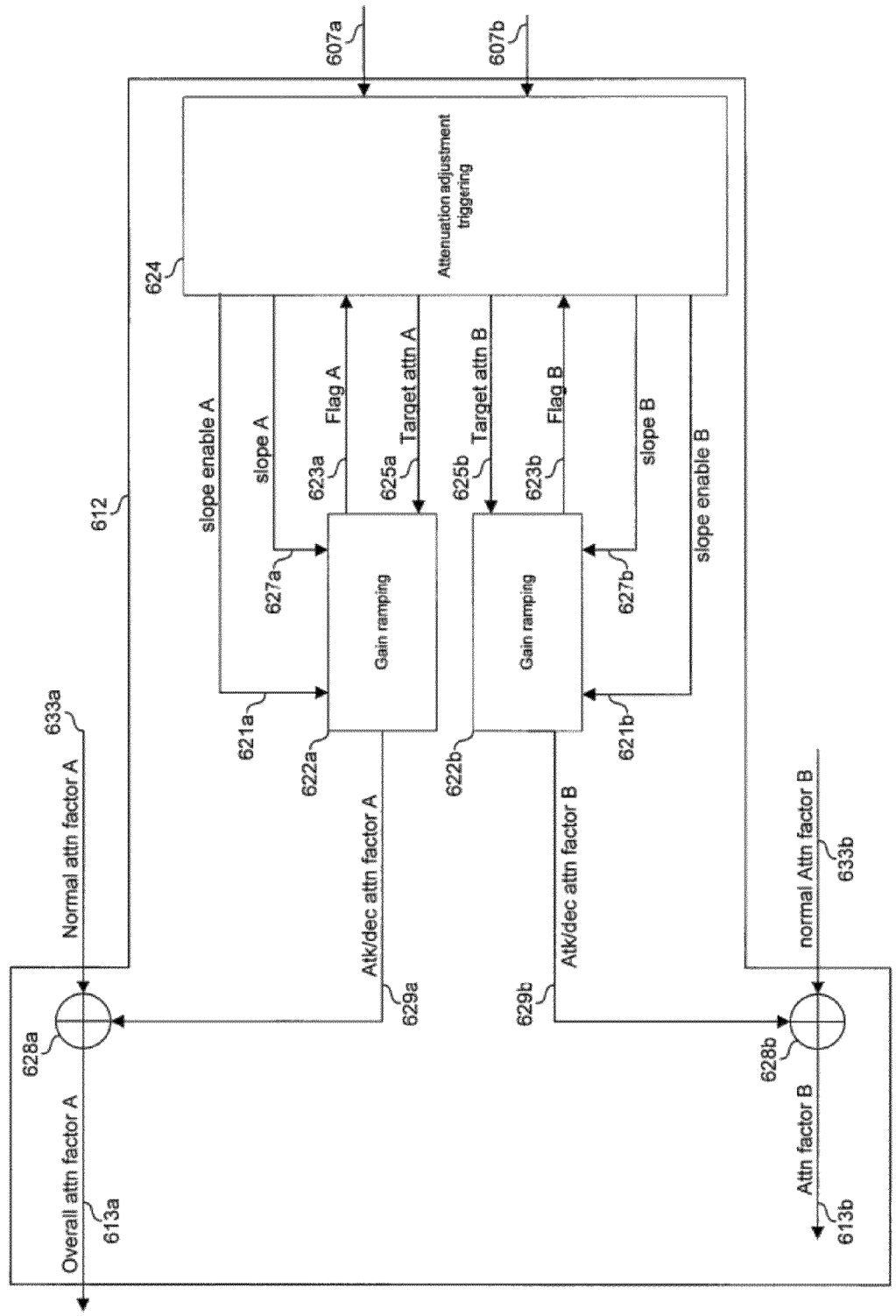
FIG. 3B is a block diagram illustrating details of an exemplary level detect and control block, in accordance with an embodiment of the invention.

FIG. 3B is a block diagram illustrating details of an exemplary level detect and control block, in accordance with an embodiment of the invention. Referring to FIG. 3B the level control block 612 may comprise attenuation adjustment triggering block 624, gain ramping blocks 622a and 622b, and adders 628a and 628b. Although portions of the level control block 612 are described with respect to an 'A' signal path, operation of a 'B' signal path may be substantially the same as the 'A' signal path, as indicated by the reference designators in brackets.

The adder 628a {628b} may comprise suitable logic, circuitry, and/or code that may be operable to add normal attenuation factor 633a {633b} and attack/delay attenuation factor 629a {629b} to generate the overall attenuation factor 613a {613b}. In various embodiments of the invention, the attenuation factors may be on a logarithmic scale and/or in decibels The gain ramping block 622a {622b} may comprise suitable logic, circuitry, and/or code that may be operable to adjust the attack/decay attenuation factor 629a {629b} based on signals received from the attenuation adjustment triggering block 624. Additional details of the gain ramping block 622a {622b} are described below with respect to FIG. 3C.

The attenuation adjustment triggering block 624 may comprise suitable logic, circuitry, and/or code that may be operable to determine when and how to adjust attack/decay attenuation factor 629a and/or 629b. Inputs to the attenuation adjustment triggering block 624 may comprise audio signals 607a and 607b and flags 623a and 623b. Outputs of the attenuation adjustment triggering block 624 may comprise slope enables 621a and 621b, slopes 627a and 627b, and target attack/decay attenuation values 625a and 625b. Additional details of an exemplary attenuation adjustment triggering block 624 are described below with respect to FIG. 3C. The audio signals 607a and 607b may be output by the filters 606a and 606b (FIG. 3A), respectively.

The flag 623a {623b} may indicate a status of the gain ramping block 622a {622b}. When flag 623a {623b} is non-zero, an adjustment of the attack/decay attenuation factor 629a {629b} may be in progress.

The target attack/decay attenuation value 625a {625b} may correspond to a value of the attack/decay attenuation factor 629a {629b} to be added to the normal attenuation factor 633a {633b}, such that the overall attenuation factor 613a {613b} keeps levels of the signal 607a {607b} below a threshold. During normal operation, the target attack/decay attenuation value 625a {625b} may be set to 0. In this regard, during normal operation (i.e. no gain attack or decay in progress), the overall attenuation factor 613a {613b} may be equal to the normal attenuation factor 633a {633b}. During a gain attack, the target attack/decay attenuation value 625a {625b} may be set to a value, $A_{atk}$, greater than 0 such that the overall attenuation factor 613a {613b} may be temporarily increased. During a gain decay, the target attack/decay attenuation value 625a {625b} may be set to 0 such that the overall attenuation factor 613a {613b} may return to the value of the normal attenuation factor 633a {633b}.

During a gain attack for which slope enable 621a {621b} is non-zero, the slope 627a {627b} may be a step size, $m_{atk}$, by which the attack/decay attenuation factor 629a {629b} may be repeatedly increased until it is equal to $A_{atk}$, or to a value, $A_{dec}$, that results in levels of the signal 607a {607b} falling below the threshold. During a gain decay for which slope enable 621a {621b} is non-zero, the slope 627a {627b} may be a step size, $m_{dec}$, by which the attack/decay attenuation factor 629a {629b} may be repeatedly decreased until it is equal to 0 or until another gain attack is triggered.

The slope enable 621a {621b} may control whether the attack/decay attenuation factor 629a {629b} is adjusted one-shot, or is ramped. During a gain attack, slope enable 621a {621b} being 0 may result in the attack/decay attenuation factor 629a {629b} being increased from 0 for one sample of the signal 607a {607b} to $A_{atk}$ for the next sample of the signal 607a {607b}. During a gain attack, slope enable 621a {621b} being non-zero may result in the attack/decay attenuation factor 629a {629b} being ramped up from 0 to $A_{atk}$ or $A_{dec}$ over a plurality of samples of the signal 607a {607b}, wherein each increase between adjacent samples may be equal to $m_{atk}$. During a gain decay, slope enable 621a {621b} being 0 may result in the attack/decay attenuation factor 629a {629b} being decreased from $A_{atk}$ or $A_{dec}$ for one sample of the signal 607a {607b} to 0 for the next sample of the signal 607a {607b}. During a gain decay, slope enable 621a {621b} being non-zero may result in the attack/decay attenuation factor 629a {629b} being ramped down from $A_{atk}$ or $A_{dec}$ to 0 over a plurality of samples of the signal 607a {607b}, wherein each decrease between adjacent samples may be equal to $m_{dec}$.

In operation, the attenuation adjustment triggering block 624 may compare an amplitude of the signals 607a and/or 607b to a threshold. When levels of signals 607a and/or 607b are above the threshold, the attenuation adjustment triggering block 624 may trigger a gain attack. In instances that signals 607a and 607b are monaural signals, the attack/decay attenuation factors 629a and 629b may be controlled independently. In this regard, a gain attack for signal 607a may only be triggered when signal 607a is above the threshold and a gain attack for signal 607b may only be triggered when signal 607b is above the threshold. Conversely, in instances that the signals 607a and 607b are left and right channels of a stereo signal, the attack/decay attenuation factors 629a and 629b may be controlled in unison. In this regard, a gain attack for both signals 607a and 607b may be triggered when either of the signals 607a and 607b is above the threshold.

During a gain attack, the attenuation factor 629a and/or 629b may be increased to either $A_{atk}$ or $A_{dec}$. In instances that levels of the signals 607a and/or 607b do not fall below the threshold before or upon reaching $A_{atk}$, then $A_{atk}$ may be increased and another gain attack may be triggered. Nevertheless, once levels of the signals 607a and 607b are below the threshold, possibly within a margin, a gain decay may be triggered. In instances that levels of the signals 607a and/or 607b go above the threshold during a gain decay, then another gain attack may be triggered. Conversely, in instances that the attack/decay attenuation factors 629a and 629b decay to 0 without triggering another gain attack, then the output audio processing block 602 may return to normal operation wherein overall attenuation factors 613a and 613b may be equal to the normal attenuation factors 633a and 633b, respectively. In instances that it may be determined that gain attacks are being triggered too frequently, the normal attenuation factor 633a and/or 633b may be increased. In instances that it may be determined that gain attacks are being triggered too infrequently, the normal attenuation factor 633a and/or 633b may be decreased.

Figure 3C:
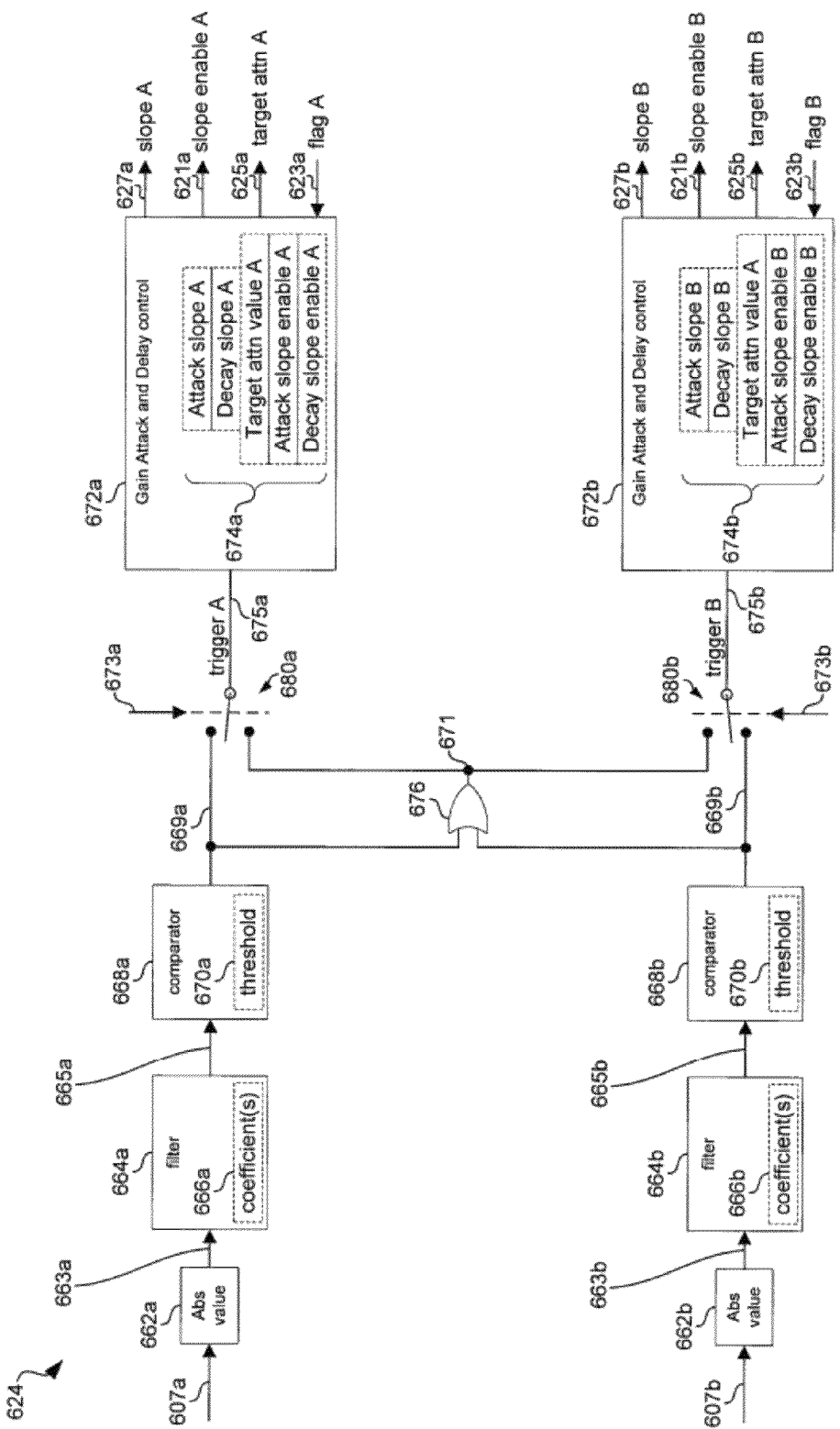
FIG. 3C is a block diagram illustrating an exemplary gain ramping block, in accordance with an embodiment of the invention.

FIG. 3C is a block diagram illustrating details of an exemplary attenuation adjustment triggering block, in accordance with an embodiment of the invention. Referring to FIG. 3C the attenuation adjustment triggering block may comprise absolute value blocks 662a and 662b, filters 664a and 664b, comparators 668a and 668b, OR gate 676, switching elements 680a and 680b, and gain attack/decay control blocks 672a and 672b.

The absolute value blocks 662a and 662b may each comprise suitable logic, circuitry, and/or code that may be operable to output a signal corresponding to the amplitude of the input signals 607a and 607b, respectively. In this manner, negative values of the signals 607a and 607b may be inverted to become positive values, such that each sample of the signals 607a and 607b may be compared to positive thresholds 670a and 670b, respectively.

The filters 664a and 664b may comprise suitable logic, circuitry, and/or code that may be operable to generate the signals 665a and 665b corresponding to the average values of the signals 663a and 663b, respectively. A response of the filters 664a and 664b may be determined, at least in part, by coefficients 666a and 666b, respectively. The coefficients 666a and 666b may be configured by, for example, the processor 156, the DSP 154, and/or the memory 158. In this regard, the coefficients 666a and 666b may be configured dynamically and/or in real-time. In an exemplary embodiment of the invention, the filters 664a and 664b may each be a single pole infinite impulse response (IIR) filter.

The comparators 668a and 668b may comprise suitable logic, circuitry, and/or code that may be operable to compare the amplitude of the signals 607a and 607b to thresholds 670a and 670b, respectively. The thresholds 670a and 670b may be configured by, for example, the processor 156, the DSP 154, and/or the memory 158. In this regard, the thresholds 670a and 670b may be configured dynamically and/or in real-time.

In an exemplary embodiment of the invention, the thresholds 670a and 670b may be determined based on an audio output device and/or uplink path for which the signals 607a and 607b may be destined.

The OR gate 676 may comprise suitable logic and/or circuitry that may be operable to assert the signal 671 when either or both signals 669a and 669b are asserted.

The switching elements 680a and 680b may comprise suitable logic, circuitry, and/or code that may be operable to communicatively couple either signals 669a or signal 671 to the gain attack/decay control block 672a and communicatively couple either signal 669b or signal 671 to the gain attack/decay control block 672b. The switching elements 680a and 680b may be configured via the signals 673a and 673b, respectively. The signals 673a and 673b may be generated by, for example, the processor 156, the DSP 154, and/or the memory 158. In this regard, the signals 673a and 673b may be configured dynamically and/or real-time.

The gain attack/decay control block 672a {672b} may comprise suitable logic, circuitry, and/or code that may be operable to generate slope 627a {627b}, slope enable 621a {621b}, and target attack/delay attenuation value 625a {625b} based on the trigger signal 675a {675b}, the flag 623a {623b}, and the parameters 674a {674b}. The parameters 674a {674b} may be configured by, for example, the processor 156, the DSP 154, and/or the memory 158. In this regard, the parameters 674a {674b} may be configured dynamically and/or real-time. The parameters 674a {674b} may comprise an attack slope value, a decay slope value, a target attenuation value, an attack slope enable, and a decay slope enable.

In operation, signals 607a and 607b may be compared to thresholds 670a and 670b, respectively. In instances that the amplitude of the signal 607a is greater than the threshold 670a, the signal 669a may be asserted. In instances that the amplitude of the signal 607b is greater than the threshold 670b, the signal 669b may be asserted. In instances that signals 607a and 607b are monaural signals, the signals 669a and 669b may be routed, via the switching elements 680a and 680b, to the trigger signals 675a and 675b, respectively. In instances that signals 607a and 607b are left and right channels of a stereo signal, the signal 671 may be communicatively coupled, via the switching elements 680a and 680b, to the trigger signals 675a and 675b.

During normal operation, 0 may be output as the target attack/decay attenuation value 625a {625b}. When trigger 675a {675b} is asserted a gain attack on the signal 607a {607b} may be triggered. During a gain attack, the attack slope parameter may output as attack/decay slope 627a {627b}, the attack slope enable parameter may be output as attack/decay slope enable 621a {621b}, and the target attenuation value parameter may be output as target attack/decay attenuation value 625a {625b}. During a gain decay, the decay slope parameter may be output as attack/decay slope signal 627a {627b}, the decay slope enable parameter may be output as attack/decay slope enable 621a {621b}, and 0 may be output as target attack/decay attenuation value 625a {625b}.

Figure 3D:
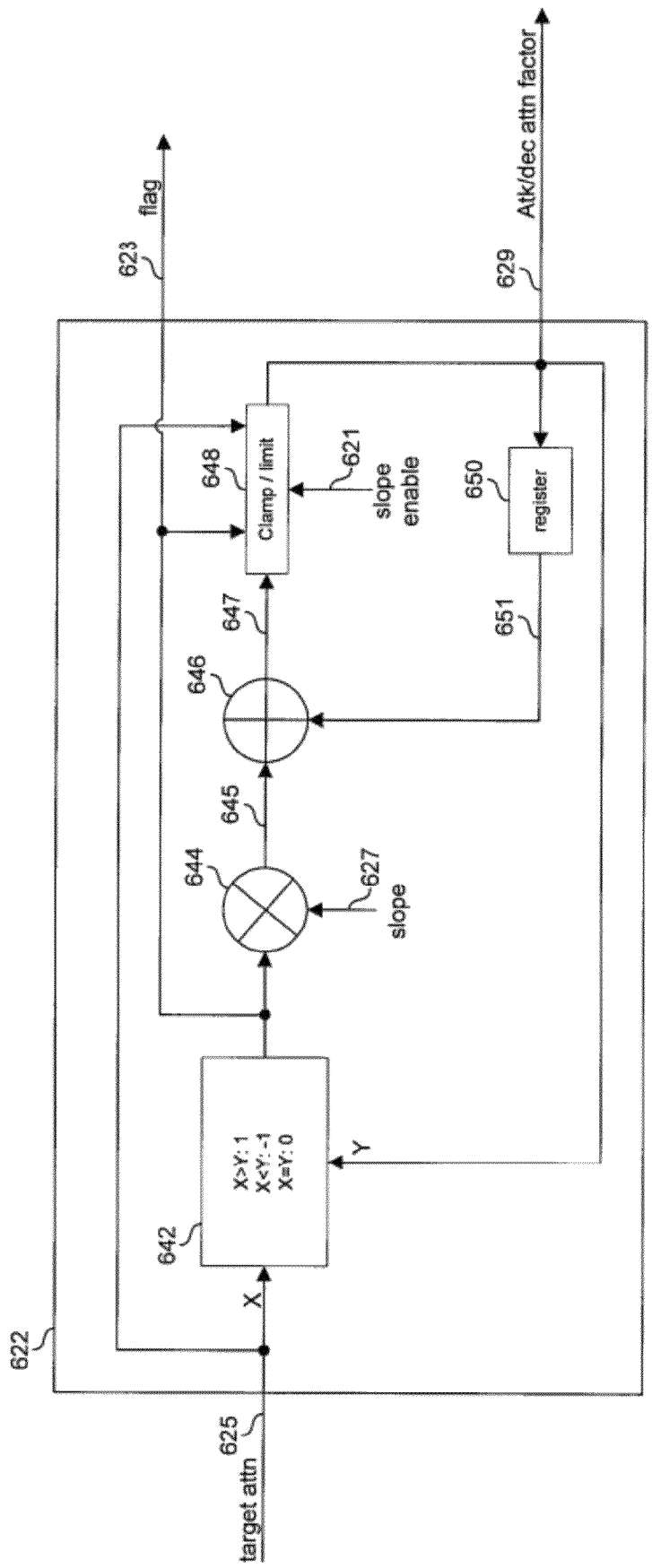
FIG. 3D is a block diagram illustrating details of an exemplary attenuation adjustment triggering block, in accordance with an embodiment of the invention.

FIG. 3D is a block diagram illustrating an exemplary gain ramping block, in accordance with an embodiment of the invention. Referring to FIG. 3D the gain ramping block 622 may comprise a comparison block 642, a multiplier 644, an adder 646, a clamping block 648, and a register 650.

The comparison block 642 may comprise suitable logic, circuitry, and/or code that may be operable to compare a target attack/decay attenuation value 625, 'X', to the attack/decay attenuation factor 629, 'Y'. In instances that 'X' may be greater than the comparison block 642 may output a value of +1 for flag 623. In instances that 'X' may be equal than 'Y', the comparison block 642 may output a value of 0 for flag 623. In instances that 'X' is less than 'Y', the comparison block 642 may output a value of −1 for flag 623.

The multiplier 644 may comprise suitable logic, circuitry, and/or code that may be operable to multiply the output of the comparison block 642 by the attack/decay slope 627 to generate the signal 645.

The adder 646 may comprise suitable logic, circuitry, and/or code that may be operable to add the signal 645 to the signal 651.

The clamping block 648 may comprise suitable logic, circuitry, and/or code that may be operable to prevent increasing the attack/decay attenuation factor 629 above the target attack/decay attenuation value 625 during a gain attack and prevent reducing the attack/decay attenuation factor 629 below 0 during a gain decay.

The register 650 may comprise one or more storage elements, such as latches and/or flip flops, for storing the value of the attack/decay attenuation factor 629.

During normal operation, when no gain attack or gain decay is in progress, the target attack/decay attenuation value 625, the attack/decay attenuation factor 629 and the flag 623 may be 0. During a gain attack, the attack/decay target attenuation value 625 may become greater than 0 and the flag 623 may become +1. Subsequent to a gain attack, a gain decay may be triggered. During a gain decay the target attack/decay attenuation value 625 may return to 0 and the flag may become −1.

In instances that a gain attack is triggered and slope enable is de-asserted, the target attack/decay attenuation value 625 may be passed directly to the attack/decay attenuation factor 629. Accordingly, target attack/decay attenuation value 625 and the attack/decay attenuation factor 629 may become equal and the flag 623 may transition from +1 to 0.

In instances that a gain attack is triggered and slope enable is asserted, the signal 645 may be a positive value equal to the slope 627 and the attack/decay attenuation factor 629 may be repeatedly increased by adding the signal 645 to the signal 651 until the flag 623 becomes 0 or −1. The flag 623 may become 0 when the attack/decay attenuation factor 629 becomes equal to the target attack/decay attenuation value 625. The flag may become −1 when a gain decay may be triggered prior to the attack/decay attenuation factor 629 reaching to the target attack/decay attenuation value 625.

In instances that a gain decay may be triggered and slope enable may be de-asserted, a value of 0 may be passed directly to the attack/decay attenuation factor 629. Accordingly, target attack/decay attenuation value 625 and the attack/decay attenuation factor 629 may become equal and the flag 623 may transition from −1 to 0.

In instances that a gain decay may be triggered and slope enable may be asserted, the signal 645 may be a negative value equal to the slope 627 and the attack/decay attenuation factor 629 may be repeatedly decreased by adding the negative valued signal 645 to the signal 651 until the flag 623 becomes 0 or +1. The flag 623 may become 0 when the attack/decay attenuation factor 629 becomes equal to 0. The flag may become +1 when a gain attack is triggered prior to the attack/decay attenuation factor 629 reaching 0.

Figure 4A:
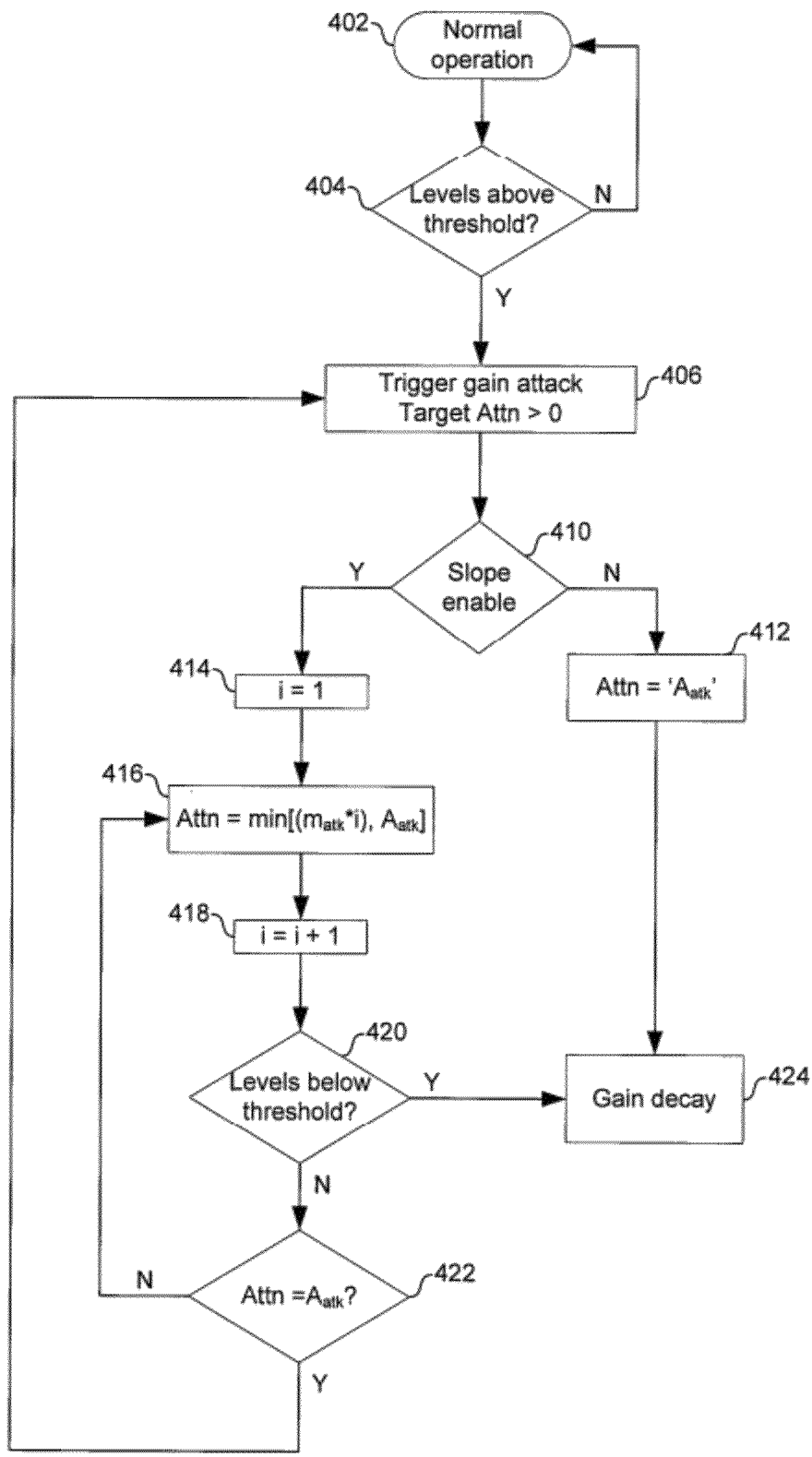
FIG. 4A is a flowchart illustrating exemplary steps for controlling audio levels, in accordance with an embodiment of the invention.

FIG. 4A is a flowchart illustrating exemplary steps for controlling audio levels, in accordance with an embodiment of the invention. Although, FIG. 4A is described with respect to a monaural signal 607a, similar steps may be utilized for a monaural signal 607b or a stereo signal comprising left and right channels 607a and 607b. Referring to FIG. 4A, the exemplary steps may begin with the level control block 612 in normal operation, i.e. neither a gain attack nor a gain decay may be in progress. Subsequent to step 402, the exemplary steps may advance to step 404.

In step 404 it may be determined whether a level of the signal 607a may be above a determined threshold. In instances that a level of the signal 607a may not be above the threshold, the exemplary steps may return to step 402.

Returning to step 404, in instances that a level of the signal 607a is above the threshold, the exemplary steps may advance to step 406. In step 406, a gain attack may be triggered by setting the target attack/decay attenuation value 625a to a value $A_{atk}$ greater than 0. Subsequent to step 406, the exemplary steps may advance to step 410.

In step 410, it may be determined whether the attack/decay slope enable 621a may be asserted. In instances that attack/decay slope enable 621a may be de-asserted, the exemplary steps may advance to step 412. In step 412, the attack/decay attenuation factor 629a may be set equal to $A_{atk}$. In this manner, the gain attack may be completed in a single adjustment of the attack/decay attenuation factor 629a and the exemplary steps may advance to step 424. In step 424, a gain decay may be triggered. Exemplary steps for a gain decay are described below with respect to FIG. 4B.

Returning to step 410, in instances that attack/decay slope enable 621a is asserted, the exemplary steps may advance to step 414. In step 414, a counter i may be set equal to 1, where i may correspond to an iteration of steps 414-422 for ramping up the attack/decay attenuation factor 629a. In this regard, each subsequent value of i may correspond to a subsequent sample of the signal 607a. Subsequent to step 414, the exemplary steps may advance to step 416. In step 416 the attack/decay attenuation factor 629a for sample i of the signal 607a may be set equal to the minimum of $m_{atk}*i$ and $A_{atk}$, where $m_{atk}$ is the value of the attack/decay slope 621a and $A_{atk}$ is the target attack/decay attenuation value 625a. Subsequent to step 416, the exemplary steps may advance to step 418. In step 418, the counter i may be incremented. Subsequent to step 418, the exemplary steps may advance to step 420. In step 420 it may be determined whether levels of the signal 607a have dropped below the threshold. In instances that levels of the signal 607a have dropped below the threshold. The exemplary steps may advance to the previously described step 424.

Returning to step 420, in instances that levels of the signal 607a have not dropped below the threshold, the exemplary steps may advance to the step 422. In step 422, it may be determined whether the attack/decay attenuation factor 629a is equal to the target attack/decay attenuation value 625a. In instances that the attack/decay attenuation factor 629a is not equal to the target attack/decay attenuation value 625a, the exemplary steps may return to previously described step 416.

Returning to step 422, in instances that the attack/decay attenuation factor 629a is equal to the target attack/decay attenuation value 625a, the exemplary steps may return to previously described step 406. In this regard, in instances that the attack/decay attenuation factor 629a is ramped up to the target attack/decay attenuation value 625a but levels of the signal 607a are still above the threshold, then a new gain attack, possibly with a higher the target attack/decay attenuation value 625a, may be triggered.

Figure 4B:
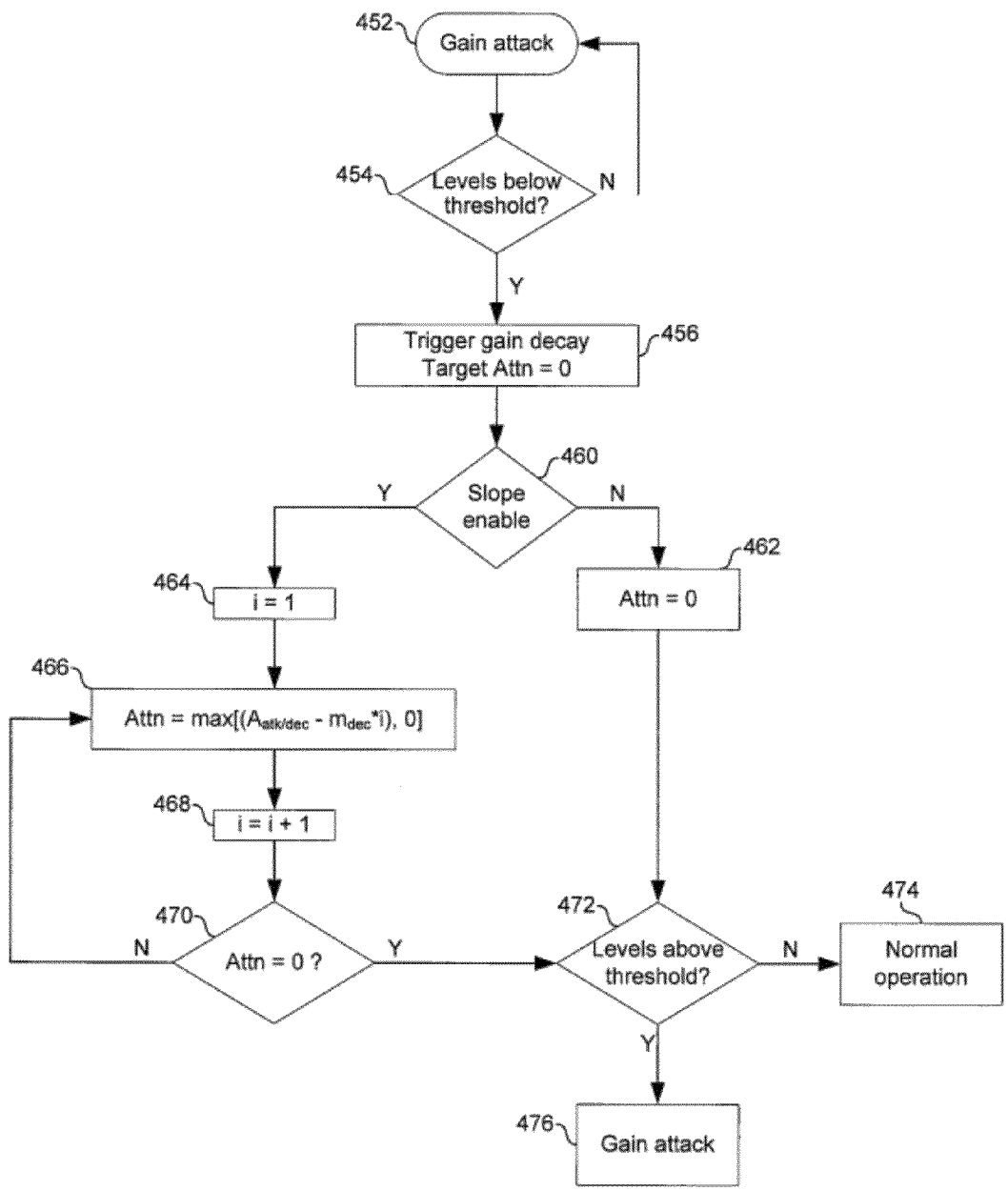
FIG. 4B is a flowchart illustrating exemplary steps for controlling audio levels, in accordance with an embodiment of the invention.

FIG. 4B is a flowchart illustrating exemplary steps for controlling audio levels, in accordance with an embodiment of the invention. Although, FIG. 4B is described with respect to a monaural signal 607a, similar steps may be utilized for a monaural signal 607b or a stereo signal comprising left and right channels 607a and 607b. Referring to FIG. 4B, the exemplary steps may begin with the level control block 612 performing a gain attack. Subsequent to step 452, the exemplary steps may advance to step 454.

In step 454 it may be determined whether a level of the signal 607a is below a determined threshold. In instances that a level of the signal 607a may not be below the threshold, the exemplary steps may return to step 452.

Returning to step 454, in instances that a level of the signal 607a is below the threshold, the exemplary steps may advance to step 456. In step 456, a gain decay may be triggered by setting the target attack/decay attenuation value 625a to 0. Subsequent to step 456, the exemplary steps may advance to step 460.

In step 460, it may be determined whether the attack/decay slope enable 621a may be asserted. In instances that attack/decay slope enable 621a is de-asserted, the exemplary steps may advance to step 462. In step 462, the attack/decay attenuation factor 629a may be set equal to 0. In this manner, the gain decay may be completed in a single adjustment of the attack/decay attenuation factor 629a and the exemplary steps may advance to step 472.

In step 472, it may be determined whether levels of the signal 607a are back above the threshold. In instances that the level of signal 607a may be back above the threshold the exemplary steps may advance to step 476 and another gain attack may be triggered. In instances that the level of signal 607a remains below the threshold, the exemplary steps may advance to step 474 and the level control block 612 may return to normal operation.

Returning to step 460, in instances that attack/decay slope enable 621a is asserted, the exemplary steps may advance to step 464. In step 464, a counter i may be set equal to 1, where i may correspond to an iteration of steps 464-470 for ramping down the attack/decay attenuation factor 629a. In this regard, each subsequent value of i may correspond to a subsequent sample of the signal 607a. Subsequent to step 464, the exemplary steps may advance to step 466.

In step 466 the attack/decay attenuation factor 629a for sample i of the signal 607a may be set equal to the maximum of $(A_{atk/dec} - m_{dec}i)$ and (0) where $A_{atk/dec}$ is either $A_{atk}$ or $A_{dec}$, which are described above with respect to FIG. 3A, and $m_{dec}$ is the value of the attack/decay slope 621a. Subsequent to step 466, the exemplary steps may advance to step 468.

In step 468, the counter i may be incremented. Subsequent to step 468, the exemplary steps may advance to step 470. In step 470 it may be determined whether the attack/decay attenuation factor 629a is back to 0. In instances that the attack/decay attenuation factor 629a has returned to 0. The exemplary steps may advance to the previously described step 472. Returning to step 470, in instances that levels of the signal 607a have not returned to 0, the exemplary steps may return to the step 466.

Exemplary aspects of a method and system for audio level detection and control are provided. In an exemplary embodiment of the invention, an amplitude of an audio signal 607a may be compared to a threshold value and an attenuation that is applied to the audio signal 607a may be adjusted based on the comparison. In instances that the amplitude of the audio signal 607a is greater than or equal to the threshold value, the adjustment may comprise increasing a first attenuation factor 629a until the amplitude of the audio signal 607a is less than the threshold. The first attenuation factor 629a may be subsequently decreased until the amplitude of the audio signal 607a is greater than or equal to the threshold or until the first attenuation factor 629a is equal to zero. An attenuation of the audio signal 607a may be controlled via a digital gain circuit 604a within the hardware audio CODEC 164. An overall attenuation factor 613a of the digital gain circuit 604a is a sum of the first attenuation factor 629a and a second attenuation factor 633a. In instances that the audio signal 607a is a left or right stereo channel, an attenuation factor 629b of a second digital gain circuit 604b may also be adjusted based on the amplitude of the signal 607a.

The first attenuation factor 629a may be incrementally increased over a number of samples of the audio signal 607a and the number of samples may be configured dynamically. In this regard, the first attenuation factor 629a may be incrementally incremented or decremented and a size of the increment or decrement may be dynamically configured. A number of samples over which the audio signal 607a may be adjusted may be dynamically configured. The threshold may be dynamically determined based, for example, on an output 237 or 241 of the hardware audio CODEC 164 to which the audio signal 607a may be destined.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for audio level detection and control.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. One embodiment may utilize a commercially available processor, which may be implemented external to an ASIC implementation of the present system. Alternatively, in an embodiment where the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method, comprising:
   increasing an attenuation factor of a digital gain circuit until an amplitude of an audio signal is less than a threshold; and
   subsequently decreasing the attenuation factor of the digital gain circuit until the amplitude of the audio signal is greater than or equal to the threshold or until the attenuation factor is equal to zero.

2. The method of claim 1, wherein the increasing comprises increasing the attenuation factor over a number of samples of the audio signal, the number of samples of the audio signal being dynamically configurable.

3. The method of claim 1, wherein the decreasing comprises decreasing the attenuation factor over a number of samples of the audio signal, the number of samples of the audio signal being dynamically configurable.

4. The method of claim 1, wherein the threshold is dynamically adjustable based on an output of an audio coder-decoder (CODEC) that includes the digital gain circuit.

5. The method of claim 1, further comprising:
   increasing an attenuation factor of a second digital gain circuit substantially in unison with the increasing of the attenuation factor of the digital gain circuit; and
   decreasing the attenuation factor of the second digital gain circuit substantially in unison with the decreasing of the attenuation factor of the digital gain circuit,
   wherein the second digital gain circuit is associated with a second audio signal, and the audio signal and the second audio signal are left and right channels of a stereo signal.

6. The method of claim 1, further comprising:
   comparing the amplitude of the audio signal with the threshold; and
   triggering the increasing of the attenuating factor if the amplitude of the audio signal is greater than or equal to the threshold.

7. The method of claim 6, further comprising:
   filtering the audio signal to form an average amplitude of the audio signal;
   wherein the comparing comprises comparing the average amplitude of the audio signal with the threshold, and
   wherein the triggering comprises triggering the increasing if the average amplitude of the audio signal is greater than or equal to the threshold.

8. The method of claim 1, further comprising:
   attenuating the audio signal by an overall attenuation factor of the digital gain circuit, wherein the overall attenuation factor is a sum of the attenuation factor and a second attenuation factor.

9. The method of claim 8, further comprising:
   increasing the second attenuation factor if the triggering occurs at a frequency greater than a maximum frequency of occurrence.

10. The method of claim 8, further comprising:
    decreasing the second attenuation factor if the triggering occurs at a frequency less than a minimum frequency of occurrence.

11. A non-transitory computer-readable medium having stored thereon computer-executable instructions, execution of which by a computing device cause the computing device to perform operations comprising:

increasing an attenuation factor of a digital gain circuit until an amplitude of an audio signal is less than a threshold; and subsequently decreasing the attenuation factor of the digital gain circuit until the amplitude of the audio signal is greater than or equal to the threshold or until the attenuation factor is equal to zero.

12. A system, comprising:
a level control block configured to:
increase an attenuation factor until an amplitude of an audio signal is less than a threshold; and
subsequently decrease the attenuation factor until the amplitude of the audio signal is greater than or equal to the threshold or until the attenuation factor is equal to zero.

13. The system of claim 12, wherein the level control block is configured to:
increase the attenuation factor over a number of samples of the audio signal, the number of samples of the audio signal being dynamically configurable.

14. The system of claim 12, wherein the level control block is further configured to:
decrease the attenuation factor by decreasing the attenuation factor over a number of samples of the audio signal, the number of samples of the audio signal being dynamically configurable.

15. The system of claim 12, wherein the threshold is dynamically adjustable based on an output of an audio coder-decoder (CODEC) that includes the level control block.

16. The system of claim 12, wherein the level control block comprises an attenuation adjustment triggering block configured to:
compare the amplitude of the audio signal with the threshold; and
trigger the increase of the attenuating factor if the amplitude of the audio signal is greater than or equal to the threshold.

17. The system of claim 16, wherein:
the attenuation adjustment triggering block comprises a filter configured to filter the audio signal to form an average amplitude of the audio signal, and the attenuation adjustment triggering block is further configured to:
compare the amplitude of the audio signal with the threshold by comparing the average amplitude of the audio signal with the threshold; and
trigger the increase of the attenuating factor if the average amplitude of the audio signal is greater than or equal to the threshold.

18. The system of claim 16, wherein the level control block is further configured to:
attenuate the audio signal by an overall attenuation factor, wherein the overall attenuation factor is a sum of the attenuation factor and a second attenuation factor.

19. The system of claim 18, wherein the level control block is further configured to:
increase the second attenuation factor if the triggering occurs at a frequency greater than a maximum frequency.

20. The system of claim 18, wherein the level control block is further configured to:
decrease the second attenuation factor if the triggering occurs at a frequency less than a minimum frequency.

* * * * *